US011887846B2

(12) United States Patent
Singhal et al.

(10) Patent No.: US 11,887,846 B2
(45) Date of Patent: Jan. 30, 2024

(54) DEPOSITION TOOL AND METHOD FOR DEPOSITING METAL OXIDE FILMS ON ORGANIC MATERIALS (71) Applicant: Lam Research Corporation, Fremont, CA (US)

(72) Inventors: Akhil Singhal, Beaverton, OR (US); Patrick Van Cleemput, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 707 days.

(21) Appl. No.: 16/804,706

(22) Filed: Feb. 28, 2020

(65) Prior Publication Data
US 2020/0199751 A1  Jun. 25, 2020

Related U.S. Application Data (62) Division of application No. 16/052,286, filed on Aug. 1, 2018, now abandoned.
(Continued)

(51) Int. Cl.
H01L 21/02 (2006.01)
H01L 21/033 (2006.01)
(Continued)

(52) U.S. Cl.
CPC ........ *H01L 21/0228* (2013.01); *C23C 16/407* (2013.01); *C23C 16/45544* (2013.01); *C23C 16/45565* (2013.01); *H01L 21/0234* (2013.01); *H01L 21/02175* (2013.01); *H01L 21/02274* (2013.01); *H01L 21/0338* (2013.01)

(58) Field of Classification Search
None
See application file for complete search history.

(56) References Cited

U.S. PATENT DOCUMENTS 3,944,684 A * 3/1976 Kane ................... C03C 17/2453
427/255.19
6,441,087 B1  8/2002 Zhou et al.
(Continued)

FOREIGN PATENT DOCUMENTS

CN  104752199 A  7/2015
CN  106164332 A  11/2016
(Continued)

OTHER PUBLICATIONS

International Search Report and Written Opinion for International Application No. PCT/US2019/035638 dated Sep. 20, 2019.
(Continued)

Primary Examiner — Scott B Geyer
(74) Attorney, Agent, or Firm — Weaver Austin Villeneuve & Sampson LLP (57) ABSTRACT An Atomic Layer Deposition (ALD) method to deposit a metal oxide layer onto an organic photoresist on a substrate using a highly reactive organic metal precursor. The deposition method protects the organic photoresist from loss and degradation from exposure to oxygen species during subsequent ALD cycles. The organic metal precursor may be an amino type precursor or a methoxy type precursor.

24 Claims, 4 Drawing Sheets

Related U.S. Application Data (60) Provisional application No. 62/690,210, filed on Jun. 26, 2018.

(51) Int. Cl.
*C23C 16/455* (2006.01)
*C23C 16/40* (2006.01)

(56) References Cited

U.S. PATENT DOCUMENTS

| | | | |
|---|---|---|---|
| 6,720,027 | B2 | 4/2004 | Yang et al. |
| 7,794,544 | B2 | 9/2010 | Nguyen et al. |
| 8,119,210 | B2 | 2/2012 | Narwankar et al. |
| 8,454,928 | B2 | 6/2013 | Dussarrat |
| 8,623,770 | B1 * | 1/2014 | Gao ................ H01L 21/0337 438/785 |
| 8,728,955 | B2 | 5/2014 | LaVoie et al. |
| 9,362,179 | B1 * | 6/2016 | Cheng ................ H01L 27/1211 |
| 9,824,893 | B1 * | 11/2017 | Smith ............... H01L 21/02175 |
| 9,934,970 | B1 * | 4/2018 | Burns ............... H01L 21/32139 |
| 9,997,371 | B1 * | 6/2018 | Agarwal ................ G03F 7/427 |
| 10,157,736 | B2 | 12/2018 | van Schravendijk et al. |
| 10,612,137 | B2 * | 4/2020 | Niskanen .......... C23C 16/45525 |
| 10,655,221 | B2 * | 5/2020 | Fukazawa ......... C23C 16/45553 |
| 11,031,245 | B2 * | 6/2021 | Smith ................ H01L 21/0337 |
| 11,515,252 | B2 * | 11/2022 | Lin ....................... H01L 23/528 |
| 2005/0266700 | A1 | 12/2005 | Jursich et al. |
| 2005/0277223 | A1 * | 12/2005 | Lee ................... H01L 21/3141 556/51 |
| 2006/0210713 | A1 | 9/2006 | Brcka |
| 2006/0211224 | A1 | 9/2006 | Matsuda |
| 2007/0116888 | A1 | 5/2007 | Faguet |
| 2007/0231487 | A1 | 10/2007 | Ishizaka |
| 2007/0238299 | A1 | 10/2007 | Niroomand et al. |
| 2011/0135842 | A1 | 6/2011 | Faguet et al. |
| 2011/0206846 | A1 | 8/2011 | Elam et al. |
| 2012/0164846 | A1 * | 6/2012 | Ha .................... H01L 21/02153 257/E21.271 |
| 2012/0213946 | A1 | 8/2012 | Elam et al. |
| 2013/0113085 | A1 * | 5/2013 | Michaelson .......... C23C 16/405 438/785 |
| 2013/0115778 | A1 * | 5/2013 | Xue .................. H01L 21/31144 257/E21.252 |
| 2014/0120723 | A1 | 5/2014 | Fu et al. |
| 2014/0367833 | A1 * | 12/2014 | Brink ................ H01L 21/0338 |
| 2015/0004806 | A1 | 1/2015 | Ndiege et al. |
| 2015/0225850 | A1 * | 8/2015 | Arora .................... C23C 16/407 216/51 |
| 2015/0247238 | A1 * | 9/2015 | Pasquale ............ H01L 21/0337 438/785 |
| 2015/0287612 | A1 | 10/2015 | Luere et al. |
| 2016/0056071 | A1 | 2/2016 | Draeger et al. |
| 2016/0148800 | A1 | 5/2016 | Henri et al. |
| 2016/0203982 | A1 | 7/2016 | Lin et al. |
| 2016/0240386 | A1 * | 8/2016 | Syun ................ H01L 21/02057 |
| 2016/0273107 | A1 | 9/2016 | Kim et al. |
| 2016/0293418 | A1 | 10/2016 | Pasquale et al. |
| 2016/0308027 | A1 * | 10/2016 | Chang ............... H01L 29/66795 |
| 2016/0314960 | A1 | 10/2016 | Cheng et al. |
| 2016/0336178 | A1 * | 11/2016 | Swaminathan ..... H01L 21/0334 |
| 2016/0362782 | A1 | 12/2016 | Cheng et al. |
| 2016/0372324 | A1 * | 12/2016 | Kao ................. H01L 21/31144 |
| 2017/0092490 | A1 * | 3/2017 | Yamazaki ........... H01L 29/7843 |
| 2017/0146909 | A1 * | 5/2017 | Smith .................. G03F 7/0042 |
| 2017/0213732 | A1 * | 7/2017 | Pierreux ........... H01L 21/31122 |
| 2018/0012759 | A1 * | 1/2018 | Smith ................ H01L 21/0228 |
| 2018/0033622 | A1 * | 2/2018 | Swaminathan ... C23C 16/45542 |
| 2018/0044790 | A1 | 2/2018 | Van Cleemput |
| 2018/0090335 | A1 * | 3/2018 | Karve ................. H01L 21/3086 |
| 2018/0108534 | A1 | 4/2018 | Shindo et al. |
| 2018/0197770 | A1 | 7/2018 | Rainville et al. |
| 2018/0233398 | A1 | 8/2018 | Van Cleemput et al. |
| 2018/0240667 | A1 * | 8/2018 | Yu .................... H01L 21/31122 |
| 2018/0308695 | A1 * | 10/2018 | LaVoie ............. H01L 21/31138 |
| 2018/0323061 | A1 * | 11/2018 | Raley ................. H01L 21/0228 |
| 2019/0043711 | A1 * | 2/2019 | Pore ..................... H01L 21/0337 |
| 2019/0062918 | A1 | 2/2019 | Shaikh et al. |
| 2019/0115190 | A1 | 4/2019 | Bingham et al. |
| 2019/0390341 | A1 | 12/2019 | Singhal et al. |

FOREIGN PATENT DOCUMENTS

| | | |
|---|---|---|
| CN | 107546106 A | 1/2018 |
| CN | 107799390 A | 3/2018 |
| GB | 1026405 | 4/1966 |
| JP | 2007056262 A | 3/2007 |
| JP | 2012142574 A | 7/2012 |
| JP | 2015111668 A | 6/2015 |
| JP | 2018006742 A | 1/2018 |
| JP | 2018064061 A | 4/2018 |
| KR | 10-2017-0141673 | 12/2017 |

OTHER PUBLICATIONS

CN Office Action dated Oct. 8, 2022, in Application No. CN201980043931 with English translation.
U.S. Final Office Action dated Dec. 30, 2019, in U.S. Appl. No. 16/052,286.
U.S. Non-Final Office Action dated Jun. 19, 2019, in U.S. Appl. No. 16/052,286.
U.S. Restriction requirement dated May 3, 2019, in U.S. Appl. No. 16/052,286.
CN Office Action dated Mar. 12, 2023, in Application No. 201980043931 with English translation.
TW Office Action dated Mar. 2, 2023, in Application No. TW108121973 with English translation.
CN Office Action dated Jun. 30, 2023, in application No. CN 201980043931 with English translation.
JP Office Action dated Jun. 6, 2023 in Application No. JP2020-572887 with English translation.

* cited by examiner

DEPOSITION TOOL AND METHOD FOR DEPOSITING METAL OXIDE FILMS ON ORGANIC MATERIALS

CROSS REFERENCE TO RELATED APPLICATIONS

This application is a Divisional of U.S. application Ser. No. 16/052,286 filed Aug. 1, 2018, which claimed the benefit of priority of U.S. Provisional Application No. 62/690,210, filed Jun. 26, 2018, both of which are incorporated herein by reference for all purposes.

BACKGROUND

Atomic Layer Deposition (ALD) is a deposition method that has the capability of controlling the thickness of thin films formed on semiconductor substrates on the order of one atomic mono-layer.

Plasma Enhanced ALD (PEALD) is a further enhancement that enables improved film properties at lower temperatures. PEALD uses chemical precursors, similar to ALD, in an RF-induced plasma to create the necessary chemical reactions to form the thin films in a highly controlled manner. PEALD offers many advantages, including low temperature processing, excellent conformity and thickness control of deposited layers and a capability of pre- and post-deposition in-situ treatments.

Multiple patterning is a technique to enhance feature density for integrated circuits (ICs) beyond the limits of photolithography. Such multi-patterning techniques include, for example, pitch splitting, sidewall image transfer, self-aligned contacts, via patterning, layout splitting, self-aligned double or quadruple patterning, to name a few. it is expected that multi-patterning will be necessary for 10 nm and 7 nm node semiconductor processes and beyond.

Self Aligned Quadruple Patterning (SAQP) is essentially two cycles of double patterning technique, often referred to as Self-Aligned Double Patterning (SADP). Both. SAQP and SAQP require a substrate with multiple layers formed thereon. For instance, the layers on the substrate may include, from the bottom layer up, a first carbon film referred to as an Ashable Hard Mask (AHM) or a Spin on Carbon layer (SOC), a Silicon Oxide $SiO_2$ layer, a second carbon AHM/SOC layer, and an Anti-Reflective Layer (ARL).

SAPD uses a photolithography step and additional etch steps to define spacer-like features on a substrate. In the SADP process, the first step is to deposit a resist material and then pattern, using photolithography, "mandrels" onto the top ARL layer on the substrate. The mandrels typically have a pitch at or close to the limit of photolithography. The mandrels are next covered with a deposition layer such as Silicon Oxide ($SiO_2$). A "spacer etch" is subsequently performed, removing (a) the horizontal surfaces of the $SiO_2$ layer and (b) the photoresist. As a result, just the vertical surfaces of the $SiO_2$ remains on the ARL layer. These vertical surfaces define "spacers", which have a pitch finer than can be achieved with conventional photolithography.

SAQP is a continuation of the above-described double patterning process. With SAQP, the $SiO_2$ spacers are used as a mask in an etch step removing the underlying ARL and second AHM layers except under the masked regions. Thereafter, the $SiO_2$ spacers are removed, leaving second mandrels formed in the AHM layer. Another $SiO_2$ layer is then deposited followed by another "spacer etch", removing (a) the horizontal portions of the $SiO_2$ layer and (b) the second mandrels. The result is a structure having $SiO_2$ spacers formed on the underlying $SiO_2$ layer. With the SAQP process, the pitch of the second $SiO_2$ spacers are finer than the first spacers and significantly beyond limits of conventional lithography.

While multi-patterning offers significant benefits and helps extend the usefulness of conventional photolithography to next generation integrated circuitry, the various processes have their limitations. In particular, the multi-patterning requires numerous deposition, photolithography and etching steps to form the spacers. The finer the pitch of the spacers, the more photolithography-etch cycles are required. These additional steps significantly add to the cost and complexity of semiconductor fabrication. A more cost effective, simpler, solution for implementing certain multi-patterning processes, such as SADP and SAQP and beyond, is therefore needed.

SUMMARY

A system and method for depositing a metal oxide layer onto an organic photoresist on a substrate using an organic metal precursor is disclosed. In a non-exclusive embodiment, the system and method is implemented in an Atomic Layer Deposition (ALD) tool, wherein each ALD cycle includes (1) a first half-cycle using the organic metal precursor for depositing the metal oxide layer onto the organic photoresist layer on the substrate and (2) a second half-cycle that includes a plasma that contains an oxygen species that tends to degrade the organic photoresist. By using a highly reactive precursor in the first half cycle, the metal oxide layer is deposited at a very fast rate, sufficient to seal and protect the organic photoresist from degradation and loss in the second half of subsequent ALD cycle(s). In a preferred but non-exclusive embodiment, the organic photoresist is effectively sealed with the metal oxide layer within three (3) ALD cycles or less.

In various non-exclusive embodiments, (a) the metal oxide layer is deposited at a rate of 1.0 Angstroms or more per ALD cycle, (b) the organic metal precursor is a metal organic for tin precursor, such as either an amino type precursor or an methoxy type precursor, (c) the organic photoresist is a carbon photoresist, a polymeric photoresist, a carbon Ashable Hard Mask film, or a carbon Anti Reflective Layer (ARL) and (d) the metal oxide layer is a tin oxide ($SnO_2$).

In yet other embodiments, the deposited metal oxide layer is used to form spacers on the substrate in a multi-patterning process flow. By using metal oxide spacers, a number of benefits are realized, including highly uniform spacers, resulting in highly dense feature patterns and smaller line widths and fewer required photolithography-etch steps. As a result, multi-patterning is significantly simplified, the cost and complexity of semiconductor fabrication is reduced, while accuracy and performance of the semiconductor devices is improved.

In yet other embodiments, the ALD tool is a Plasma Enhanced ALD tool (PEALD).

BRIEF DESCRIPTION OF THE DRAWINGS

The present application, and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not necessarily to scale.

DETAILED DESCRIPTION

The present application will now be described in detail with reference to a few non-exclusive embodiments thereof as illustrated in the accompanying drawings. In the following description, numerous specific details are set forth in order to provide a thorough understanding of the present disclosure. It will be apparent, however, to one skilled in the art, that the present discloser may be practiced without some or all of these specific details. In other instances, well known process steps and/or structures have not been described in detail in order to not unnecessarily obscure the present disclosure.

Figure 1:
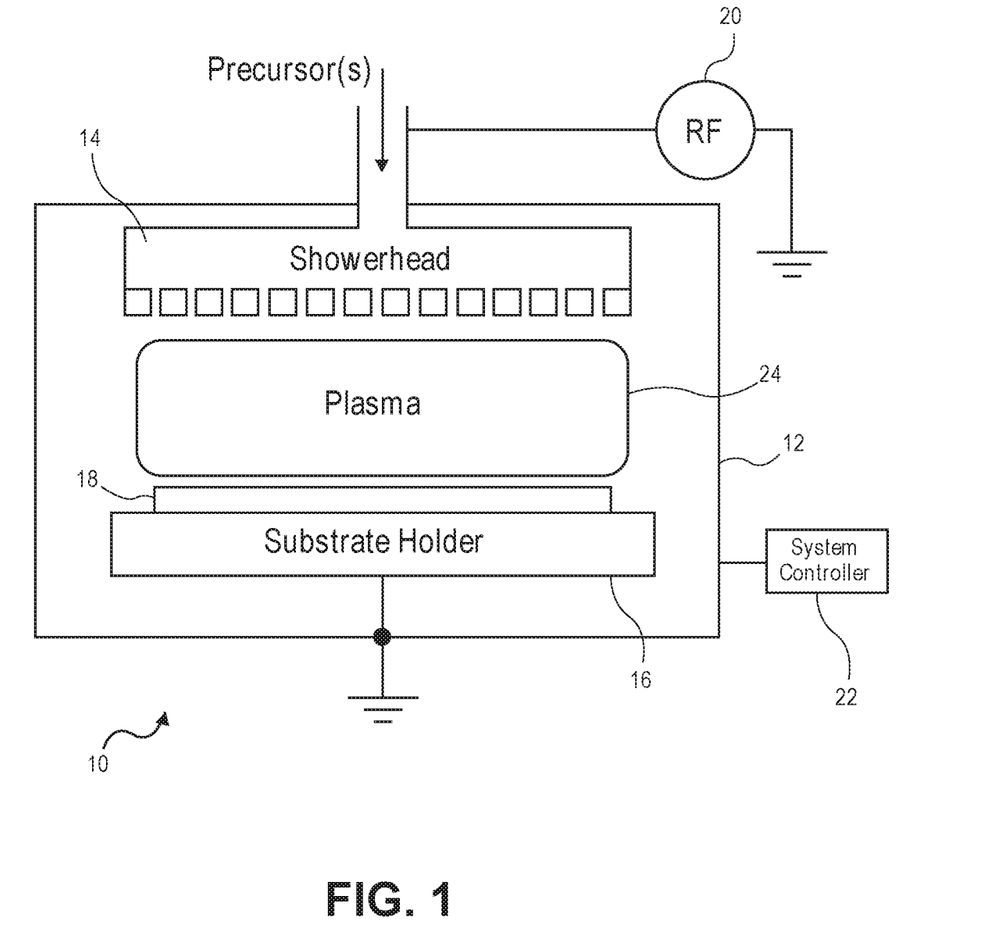
FIG. 1 is a block diagram of an Atomic Deposition Layer (ALD) tool in accordance with a non-exclusive embodiment of the invention.

Referring to FIG. 1, a block diagram of an Atomic Deposition Layer (ALD) tool 10 is illustrated. The tool 10 includes a processing chamber 12, a showerhead 14, a substrate holder 16 for positioning/holding a substrate 18, an optional RF source 20 and a system controller 22. During operation, reactant gas(es) or "precursors" are supplied into the process chamber 12 one at a time through the shower head 14. Within the shower head 14, the precursor is distributed via one or more plenums (not illustrated) into the chamber 12, in the general area above the surface of the substrate 18.

A two-part ALD cycle is used to form a film on the top surface of the substrate 18:

(1) In a first half of the ALD cycle, a first precursor is introduced via the showerhead 14 into the processing chamber 12. The first precursor reacts with the substrate 18, depositing a first layer of first particles on the surface. The processing chamber 12 is then purged.

(2) In the second half of the ALD cycle, a second precursor is introduced into the processing chamber. The second precursor also reacts with the substrate 18, forming a second layer of second particles on the surface.

The reaction of both the first and second precursors is self-limiting, meaning once a particular area of the surface of the substrate 18 is covered by a particle, additional particles do not accumulate in that same area. As a result, each reactant forms an atomic monolayer on the surface of the substrate 18.

The above ALD cycle may be sequentially performed multiple times, creating alternating mono-layers of first and second particles. When a film of desired thickness is achieved, the ALD cycles are stopped and the process is complete.

In a non-exclusive embodiment, the ALD tool 10 is a Plasma Enhanced ALD or "PEALD" tool. With PEALD tools, an RF potential generated by the optional RF generator 20, is applied to an electrode (not illustrated), either on the showerhead 14, the substrate holder 18 (also not shown), or possibly both the showerhead 14 and the substrate holder 18. Regardless of how applied, the RF potential generates a plasma 24 within the processing chamber 12.

During an ALD cycle in a PEALD tool, the first precursor is introduced into the processing chamber 12 and the RF potential is applied. The resulting plasma 24 causes energized electrons to ionize or dissociate (i.e., "crack") from the first precursor, creating chemically reactive radicals. As these radicals react, the particles deposit and form the atomic monolayer on the substrate 18. When the atomic mono-layer is complete, the processing chamber is purged. The second precursor is then introduced into the processing chamber 12, a plasma is generated by the RF potential, and another mono-layer of second particles is formed on the surface of the substrate 18. The aforementioned two-part ALD cycle may be repeated multiple times until a film, formed from the alternating mono-layers of first and second particles, is of a desired thickness.

In various non-exclusive embodiments, the RF generator 20 may be a single RF generator or multiple RF generators capable of generating high, medium and/or low RF frequencies. For example, in the case of high frequencies, the RF generator 20 may generate frequencies ranging from 2-100 MHz and preferably 13.56 MHz or 27 MHz. When low frequencies are generated, the range is 50 KHz to 2 MHz, and preferably 350 to 600 KHz. In yet other embodiments, the RF source 20 may be inductively coupled or passively coupled to the RF generating electrode(s) provided on the showerhead 14 and/or the substrate holder 16 as previously noted.

With multi-patterning, the ability to deposit metal oxides is advantageous for several reasons. Such metal oxide films offer the benefits of (1) improved etch selectivity and (2) simplified multi-patterning processes, potentially reducing the required number of photoresist and etch steps.

However, the deposition of such thin metal films on organic carbon layers using conventional ALD precursors is problematic for several reasons. Conventional precursors used in the first half of the ALD cycle, such as Tetramethyltin, results in a very slow growth rate (e.g., in the order of 0.1 to 0.2 Angstroms) per ALD cycle. As a result, significant loss and degradation occurs to the organic carbon layers during the second half of the ALD cycle due to exposure to oxygen species.

With multi-patterning, sidewall uniformity of spacers is critically important. With conventional precursors used in ALD processes, however, the resulting sidewalls of spacers are substantially non-uniform due to losses and degradation incurred during the ALD cycle. The compromise of sidewall spacers generally makes conventional precursors incompatible with patterning metal oxides films, such as tin oxide ($SnO_2$), in multi-patterning processes.

The Applicant has defined an ALD cycle that relies on one of several highly reactive precursors. By using a highly reactive precursor, the growth rate of metal oxides, even at lower temperatures commonly used with PEALD tools, occurs much faster in the first half of the ALD cycle. As a result, the metal oxide effectively "seals" the underlying organic layer. The organic layer is thus substantially protected from significant loss/degradation due to exposure to oxygen species during the second half of the ALD cycle.

In a non-exclusive embodiment, the metal oxide layer is tin oxide ($SnO_2$) deposited onto the organic photoresist during one or more ALD cycles. With tin oxide, the first half cycle uses a first precursor containing tin (Sn) and a second precursor containing an oxygen ($O_2$) species for the second half cycle. Each ALD cycle includes:

(1) a first half-cycle using a highly reactive organic metal precursor containing tin for depositing the metal oxide layer onto the organic photoresist layer on the substrate; and (2) a second half-cycle that includes an oxygen ($O_2$) species. A side effect of the oxygen species, however, is that it that degrades the organic photoresist.

With an organic metal precursor that is highly reactive, the deposited metal oxide layer effectively seals the organic photoresist within three (3) ALD cycles or less. For instance, if each first half cycle results in the metal oxide layer thickness of 1.0 Angstroms or more, then the organic photoresist will be effectively sealed from exposure from the oxygen species during the second half of the ALD cycles.

In non-exclusive embodiments, the organic metal precursor is a metal organic tin precursor, such as an amino type precursor or a methoxy type precursor. Examples of amino precursors include (a) Dimethylaminodimethyltin ($Me_2Sn(NMe_2)_2$), (b) Dimethylaminotrimethyltin ($Me_3Sn(NMe_2)$ or (c) Tetrakisdimethylamino tin ($Sn(NMe_2)_4$). d) Tetrakisdiethylamino tin ($Sn(NEt2)_4$). Examples of a methoxy type precursor include (a) Dibutyl dimethoxy tin ($Bu_2Sn(OMe)_2$) and (b) amino tin and methoxy metal organic tin precursors.

In yet other non-exclusive embodiments, the organic photoresist is a carbon photoresist, a polymeric photoresist, a carbon Hard Mask film and/or an Anti Reflective Layer (ARL).

By way of comparison, the Applicant has found that a conventional precursor resulted in a slow growth rate of the metal oxide layer in the order 0.1 to 0.2 Angstroms and a loss of the carbon layer in the range of more than 25 nanometers per ALD cycle. On the other hand, the use of one of the above-listed highly reactive precursors that accelerates growth in the order of 1.0-2.0 Angstroms per ALD cycle, losses were limited to less than 0.5 nanometers per ALD cycle. By limiting the losses to such a significant degree, the deposit of thin film oxides, such as tin oxide ($SnO_2$), becomes plausible in multi-patterning processes.

ALD Cycle Details

In a non-exclusive embodiment, process parameters for exemplary first and second half cycles of an ALD cycle for depositing a metal oxide layer, such as tin oxide ($SnO_2$) onto an organic photoresist, such as carbon, using an organic metal precursor are provided below.

The process parameters for first half cycle include (a) one of the above-listed organic metal precursors at a flow rate of 0.1 to 0.5 liters per minute, (b) a temperature ranging from room or ambient temperature to 125° C., (c) an RF frequency of 13.5 MHz and a potential ranging from 50 to 1250 Watts, a chamber pressure ranging from 1.0 to 6.0 Torr, and a duration of 1.0 to 3.0 seconds.

The process parameters for second half cycle include (a) a plasma containing an oxygen species such as oxygen, nitrous oxide, carbon dioxide, ozone with flow rate of 0.1 to 2 liters per minute, (b) a temperature ranging from room or ambient temperature to 125° C., (c) an RF frequency of 13.5 MHz and a potential ranging from 50 to 1200 Watts, a chamber pressure ranging from 1.0 to 6.0 Torr, and a duration of 1.0 to 3.0 seconds. In yet other embodiments, Argon and helium can be included in the with the oxygen species in the second half of the cycle. The presence of Argon and helium aids in creating more uniform plasma in the chamber

Multi-Patterning Processes

The ability to deposit metal oxides over organic layers creates opportunities for significantly improving and simplifying multi-patterning by reducing (1) the number of layers involved and (2) the number of required lithography-etch cycles. These benefits are realized by introducing or creating spacers made from metal oxides, previously not plausible due non-uniformity issues as discussed above.

Referring to FIGS. 2A-2E, a series of cross-sections of a substrate 18 showing the processing steps of a Self Aligned Quadruple Patterning (SAQP) sequence using metal oxide spacers is shown.

Figure 2A:
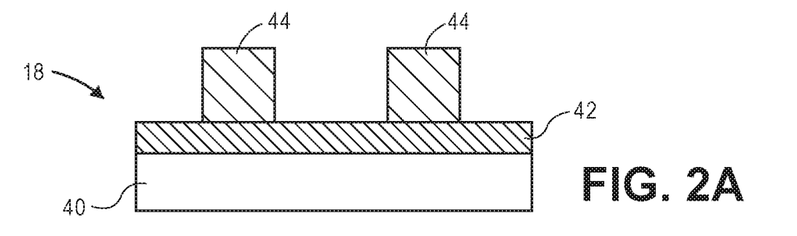
FIGS. 2A-2E are a series of semiconductor substrate cross sections showing the processing steps of a Self Aligned Quadruple Patterning (SAQP) process in accordance with a non-exclusive embodiment of the invention.

In FIG. 2A, the cross-section includes an organic Ashable Hard Mask (AHM) layer 40 and an organic Anti Reflective Layer (ARL) 42 formed on substrate 18. Mandrels 44, created by a photolithography step, are provided on the organic ARL layer 42. In certain embodiments, the mandrels 44 typically, although not necessarily, have a pitch equal or close to the limit of conventional lithography. In other embodiments, the mandrels 44 have a pitch that is larger than the limit. In yet other embodiments, the organic layers 42, 44 can be carbon and/or polymeric materials.

Figure 2B:
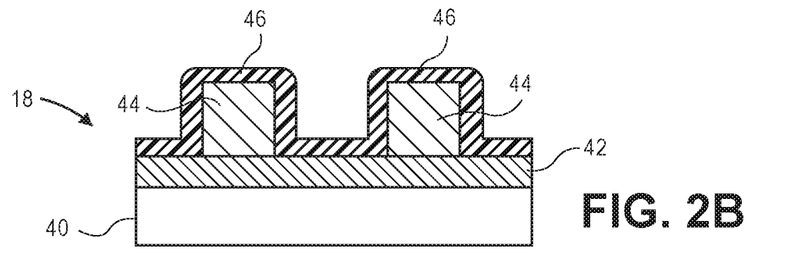

In FIG. 2B, a metal oxide layer 46 is formed over the mandrels 44 and the ARL layer 42. The metal oxide layer 46 is formed using three or less ALD cycles in the tool 10 as described above. In other words, a metal oxide layer having a thickness of at least 1.0 Angstroms is deposited per each half cycle. These layers serves to effectively seal the underling organic mandrels 44 and ARL layer 42 from degradation and loss during the second half of each ALD cycle. In a non-exclusive embodiment, the metal oxide layer is tin oxide ($SnO_2$).

Figure 2C:
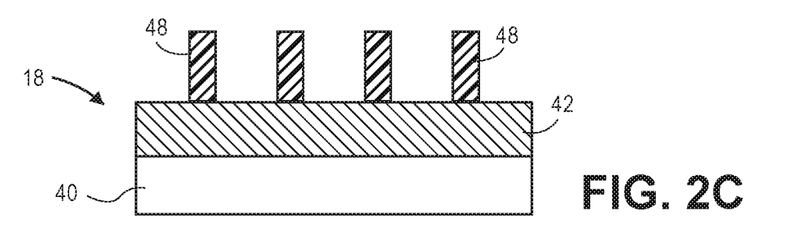

In FIG. 2C, the substrate 18 is shown after a "spacer etch", which removes (a) the horizontal portions of the metal oxide layer 46 and (b) the mandrels 44. The resulting structure defines a plurality of metal oxide spacers 48. The metal oxide spacers 48 effectively act as second mandrels having a pitch that is significantly smaller than the mandrels 44.

Figure 2D:
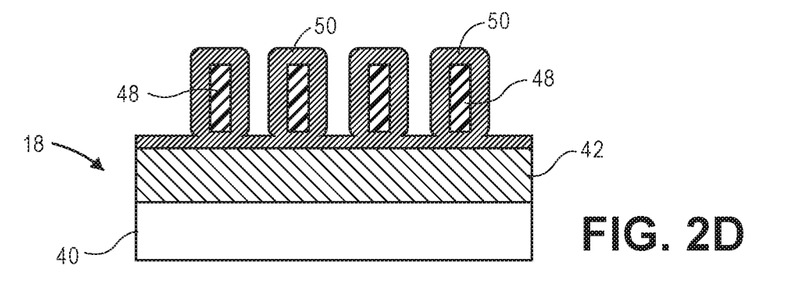

In FIG. 2D, a Silicon Oxide ($SiO_2$) layer 50 is formed over the metal oxide spacers 48.

Figure 2E:
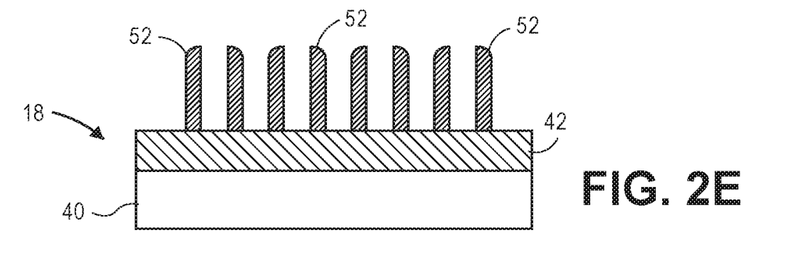

Finally, in FIG. 2E, a second spacer etch is performed, removing (a) the horizontal portions of the Silicon Oxide layer 50 and (b) the second mandrels (e.g., the metal oxide spacers 48). The resulting structure includes a plurality of Silicon Oxide spacers 52 on substrate 18 having a pitch that is significantly smaller than the metal oxide spacers 48.

By way of example, certain embodiments of the first mandrels 44 may have a pitch ranging from 32 to 128 nanometers, the metal oxide spacers 48 have a pitch ranging from 16 to 32 nanometers and the Silicon Oxide spacers 52 have a pitch ranging from 8 to 16 nanometers. The SAQP process described above thus results in lines and features having significantly smaller dimensions than possible with conventional precursors. It should be understood that these ranges merely exemplary and should not be construed as limiting. As semiconductor fabrication processes improve and feature sizes become smaller and smaller, these ranges will likely become smaller and smaller as well.

Using highly reactant precursors enables the formation of highly uniform metal oxide spacers, which offer a number of benefits. First, the uniformity of metal oxide spacers enables lines that are highly dense, resulting in very small feature sizes. Second, metal oxide spacers have a high modulus. Third, metal oxide spacers also reduce the number of photoresist-etch steps compared to conventional multi-patterning relying on conventional reactant precursors. By eliminating processing steps, the cost and complexity of multi-patterning, is reduced, while improving accuracy and performance.

In the above embodiments, tin oxide (SnO$_2$) is the only metal oxide mentioned. It should be understood, however, that other metal oxides may also be used, such as titanium dioxide, hafnium dioxide, zirconium dioxide, tantalum oxide, etc.

Figure 3:
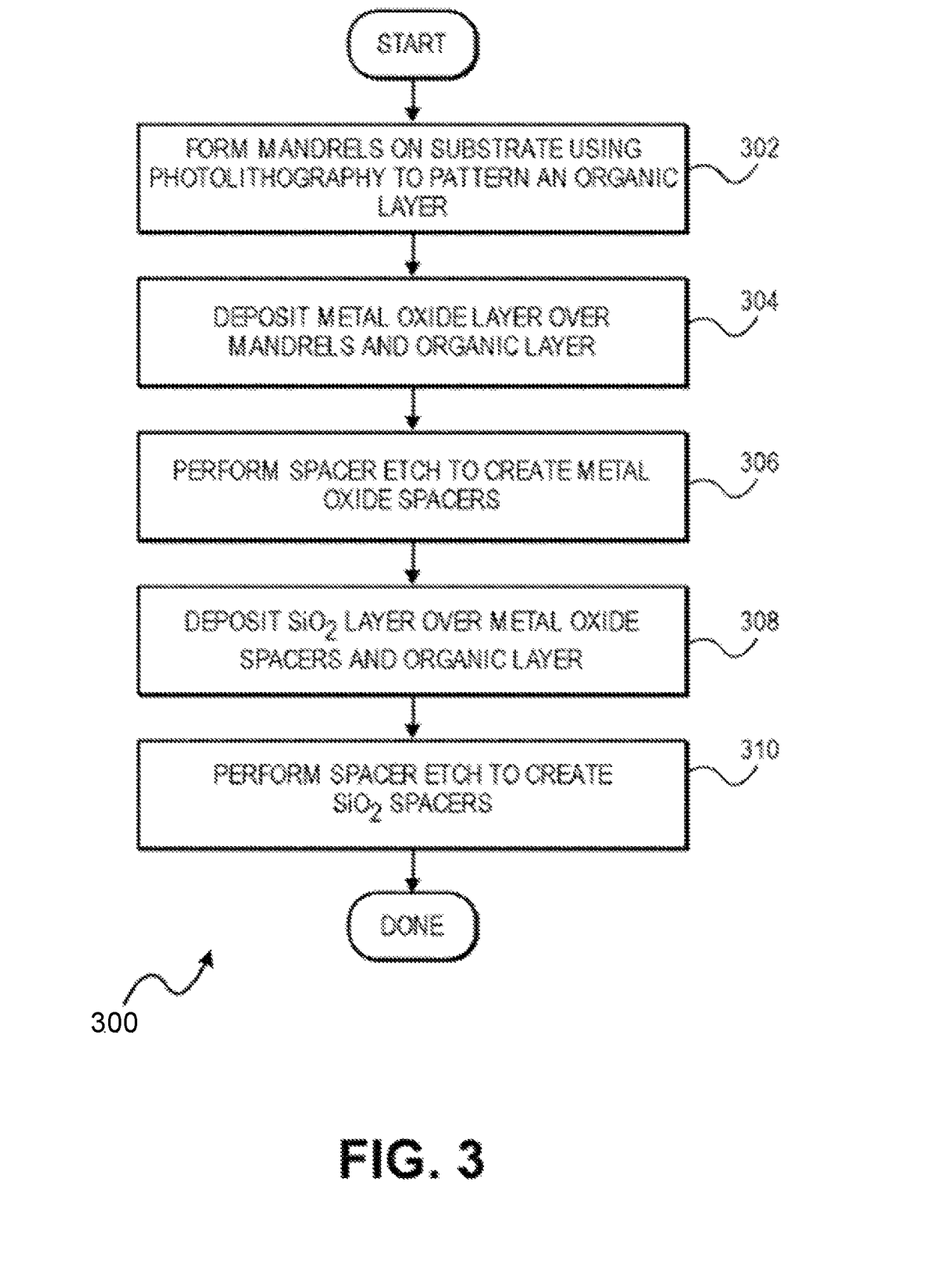
FIG. 3 is a flow diagram illustrating the process steps for implementing SAQP in accordance with a non-exclusive embodiment of the invention.

Referring to FIG. 3, a flow diagram 300 illustrating the process steps for implementing the SAQP sequence as described above is shown.

In step 302, mandrels 44 are formed on the substrate 18 using photolithography to pattern an organic layer, such as carbon or polymeric material.

In step 304, the metal oxide layer 46 is deposited over the mandrels 44 and underlying organic layer. The metal oxide layer 46 is deposited using a highly reactive organic metal precursor, such as one of those listed above.

In step 306, a spacer etch is performed removing (a) the horizontal portions of the metal oxide layer 46 and (b) the mandrels 44. The result of the spacer etch is metal oxide spacers 48. The metal oxide spacers 48 effectively define second mandrels that have a pitch finer than the first mandrels 44.

In step 308, a layer of Silicon Oxide (SiO$_2$) 50 is deposited over the substrate 18, including Silicon Oxide (SiO$_2$).

In step 410, a second spacer etch is preformed, removing (a) the horizontal portions of the Silicon Oxide (SiO$_2$) 50 and (b) Silicon Oxide (SiO$_2$). The net result is spacers 52 having a significantly smaller pitch than the mandrels 44.

System Controller

Figure 4:
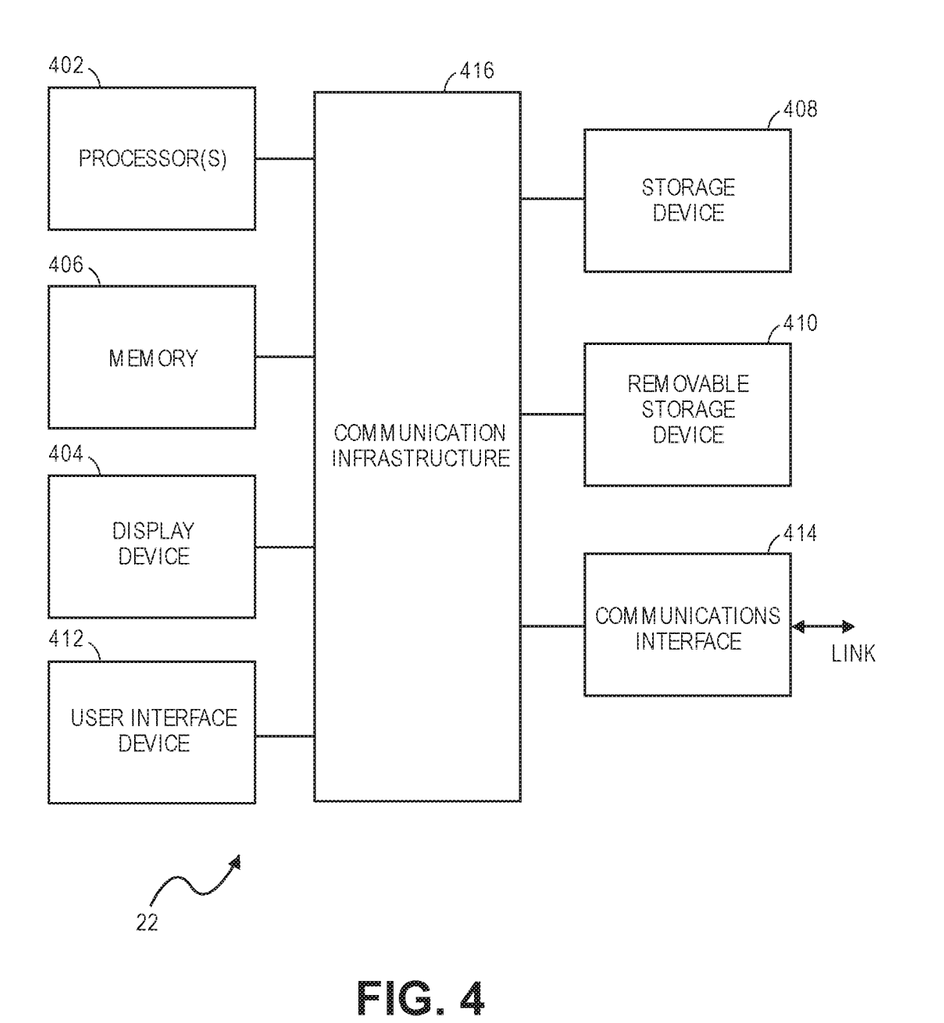
FIG. 4 is a block diagram of a system controller used for controlling an ALD tool in accordance with a non-exclusive embodiment of the invention.

Referring to FIG. 4, a block diagram of the system controller 22 in accordance with a non-exclusive embodiment of the invention. The system controller 24 is used to control the overall operation of the ALD (or PEALD) tool 10 in general and manage process conditions during deposition, post deposition, and/or other process operations.

The system controller 24 may have many physical forms ranging from an integrated circuit, a printed circuit board, a small handheld device, personal computer, server, a super computer, any of which may have one or multiple processors. The computer system 24 further can include an electronic display device 404 (for displaying graphics, text, and other data), a non-transient main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the system controller 24 and external devices via a link. The system controller 24 may also include a communications infrastructure 216 (e.g., a communications bus, cross-over bar, or network) to which the aforementioned devices/modules are connected.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals.

In certain embodiments, the system controller 24, running or executing system software or code, controls all or at least most of the activities of the tool 10, including such activities as controlling the timing of the processing operations, frequency and power of operations of the RF generator 20, pressure within the processing chamber 12, flow rates of reactants, concentrations and temperatures within the process chamber 12, timing of purging the processing chamber, etc.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network. Furthermore, method embodiments may execute solely upon the processors or may execute over a network such as the Internet, in conjunction with remote processors that shares a portion of the processing.

It should be understood that the embodiments provided herein are merely exemplary and should not be construed as limiting in any regard. In general, the present application is intended to cover any a shower head having at least two set of holes defining two spiral patterns and two plenums for the two patterns respectfully.

Although only a few embodiments have been described in detail, it should be appreciated that the present application may be implemented in many other forms without departing from the spirit or scope of the disclosure provided herein. For instance, the substrate can be a semiconductor wafer, a discrete semiconductor device, a flat panel display, or any other type of work piece.

Therefore, the present embodiments should be considered illustrative and not restrictive and is not to be limited to the details given herein, but may be modified within the scope and equivalents of the appended claims.

What is claimed is:

1. A method, comprising:
   depositing a metal layer onto an organic photoresist on a substrate using an organic metal precursor during a first half of an Atomic Layer Deposition (ALD) cycle; and
   exposing the substrate with the metal layer deposited onto the organic photoresist to an oxygen species during a second half of the ALD cycle to form a deposited metal oxide layer,
   wherein the organic metal precursor is sufficiently reactive to seal the organic photoresist with the deposited metal oxide layer from degradation by the oxygen species within three of the ALD cycles or less.

2. The method of claim 1, further comprising depositing the metal oxide layer at a thickness of 1.0 Angstroms or more per ALD cycle.

3. The method of claim 1, wherein the organic metal precursor is a metal organic tin precursor.

4. The method of claim 3, wherein the organic metal precursor is dibutyldimethoxytin.

5. The method of claim 1, wherein the organic metal precursor is an amino type precursor.

6. The method of claim 5, wherein the amino type precursor is selected from a group including:
   (a) Dimethylaminotrimethyltin (Me$_3$Sn(NMe$_2$)
   (b) Tetrakisdimethylamino tin (Sn(NMe$_2$)$_4$); or
   (c) Tetrakisdiethylamino tin (Sn(NEt$_2$)$_4$).

7. The method of claim 1, wherein the organic photoresist is one of the following:
   (a) a carbon photoresist;
   (b) a polymeric photoresist;
   (c) a carbon mask film; or
   (d) an Anti Reflective Layer (ARL).

8. The method of claim 1, wherein the metal oxide layer is a tin oxide ($SnO_2$) and the organic photoresist is either a carbon photoresist or a carbon Anti Reflective Layer (ARL).

9. The method of claim 1, further comprising using the deposited metal oxide layer to form spacers on the substrate in a multi-patterning process flow.

10. A multi-patterning method performed on a substrate, the method comprising:
   using photolithography to pattern an organic photoresist to define mandrels on the substrate;
   depositing a layer of metal oxide over the mandrels on the substrate using an organic metal precursor; and
   forming metal oxide spacers on the organic photoresist on the substrate by removing substantially horizontal surfaces of the layer of the metal oxide and the mandrels from the substrate;
   wherein depositing the layer of metal oxide comprises performing three or fewer Atomic Layer Deposition (ALD) cycles on the substrate.

11. The multi-patterning method of claim 10, further comprising:
   forming a Silicon Oxide ($SiO_2$) layer over the metal oxide spacers on the substrate; and
   forming $SiO_2$ spacers on the substrate by removing horizontal portions of the Silicon Oxide ($SiO_2$) layer and the metal oxide spacers.

12. The multi-patterning method of claim 11, wherein the metal oxide spacers have a pitch that is smaller than the mandrels and the $SiO_2$ spacers have a pitch that is smaller than the metal oxide spacers.

13. The multi-patterning method of claim 10, wherein each ALD cycle results in a metal oxide film having a thickness of 1.0 Angstroms or more.

14. The multi-patterning method of claim 13, wherein each ALD cycle further comprises:
   depositing a metal, forming a metal film during a first half-cycle; and
   exposing the substrate to an oxygen species during a second half-cycle,
   wherein the metal film deposited during the first half-cycle aids in preventing the oxygen species from degrading the mandrels during the second half-cycle.

15. The multi-patterning method of claim 14, wherein depositing the metal film during the first-half cycle further comprises introducing an organic metal precursor into a processing chamber at a flow rate ranging from 0.1 to 0.5 liters per minute.

16. The multi-patterning method of claim 14, further comprising ranging a duration of the first half cycle from 1.0 to 3.0 seconds.

17. The multi-patterning method of claim 13, wherein each ALD cycle is performed at a temperature ranging from room temperature to 125° C.

18. The multi-patterning method of claim 10, wherein the organic metal precursor is a metal organic tin precursor.

19. The multi-patterning method of claim 10, wherein the organic metal precursor is an amino type precursor.

20. The multi-patterning method of claim 10, wherein the organic metal precursor is selected from a group including:
   (a) Dimethylaminotrimethyltin ($Me_3Sn(NMe_2)$);
   (b) Tetrakisdimethlyamino tin ($Sn(NMe_2)_4$); or
   (c) Tetrakisdiethylamino tin $Sn(NEt_2)_4$).

21. The multi-patterning method of claim 10, wherein the organic metal precursor is a methoxy type precursor.

22. The multi-patterning method of claim 21, wherein the organic metal precursor is dibutyldimethoxytin.

23. The multi-patterning method of claim 10, wherein the organic photoresist is one of the following:
   (a) a carbon photoresist;
   (b) a polymeric photoresist;
   (c) a carbon mask film; or
   (d) a carbon Anti Reflective Layer (ARL).

24. The multi-patterning method of claim 10, wherein the metal oxide layer is a tin oxide ($SnO_2$) and the organic photoresist is either a carbon photoresist or a carbon Anti Reflective Layer (ARL).

* * * * *